(12) United States Patent
Wanda

(10) Patent No.: US 8,564,203 B2
(45) Date of Patent: Oct. 22, 2013

(54) DISCHARGE LAMP UNIT

(75) Inventor: Yoshihiro Wanda, Okazaki (JP)

(73) Assignee: Denso Corporation, Kariya (JP)

( * ) Notice: Subject to any disclaimer, the term of this patent is extended or adjusted under 35 U.S.C. 154(b) by 846 days.

(21) Appl. No.: 12/692,013

(22) Filed: Jan. 22, 2010

(65) Prior Publication Data
US 2010/0187996 A1    Jul. 29, 2010

(30) Foreign Application Priority Data

Jan. 23, 2009 (JP) .................................. 2009-013106

(51) Int. Cl.
*H01J 17/34* (2006.01)
*H01J 1/62* (2006.01)

(52) U.S. Cl.
USPC ................................ 315/56; 315/82; 313/493

(58) Field of Classification Search
USPC ............ 315/56, 62, 82, 84; 313/318, 490, 493
See application file for complete search history.

(56) References Cited

U.S. PATENT DOCUMENTS

| | | | | |
|---|---|---|---|---|
| 4,490,649 A | * | 12/1984 | Wang | 315/50 |
| 4,794,301 A | * | 12/1988 | Misono et al. | 313/490 |
| 5,228,766 A | * | 7/1993 | Makita et al. | 362/538 |
| 6,710,545 B2 | | 3/2004 | Yamaguchi et al. | |
| 8,322,887 B2 | * | 12/2012 | Morris et al. | 362/264 |

FOREIGN PATENT DOCUMENTS

| | | |
|---|---|---|
| JP | 2002-109951 | 4/2002 |
| JP | 2003-022702 | 1/2003 |

OTHER PUBLICATIONS

Japanese Office Action dated Jan. 11, 2011, issued in corresponding Japanese Application No. 2009-013106 with English Translation.

* cited by examiner

*Primary Examiner* — Jimmy Vu
(74) *Attorney, Agent, or Firm* — Nixon & Vanderhye P.C.

(57) ABSTRACT

A discharge lamp unit has a supporting member supporting a discharge lamp, a circuit substrate supplying electric power to the discharge lamp, a housing case member, a separation wall, and a hollow part. The housing case member supports the circuit substrate in an inside space thereof and the supporting member. The supporting member is exposed to an outside of the housing case member. The separation wall separates the supporting member from the circuit substrate in the inside space of the housing case member. The hollow part is formed between the separation wall and the circuit substrate. When the supporting member is heated by heat energy of the discharge lamp, the separation wall shields the heat conduction from the supporting member to the circuit substrate. The presence of the hollow part between the separation wall and the circuit substrate prevents heat conduction from the discharge lamp side to the circuit substrate.

14 Claims, 3 Drawing Sheets

DISCHARGE LAMP UNIT

CROSS-REFERENCE TO RELATED APPLICATION

This application is related to and claims priority from Japanese Patent Application No. 2009-013106 filed on Jan. 23, 2009, the contents of which are hereby incorporated by reference.

BACKGROUND OF THE INVENTION

1. Field of the Invention

The present invention relates to a discharge lamp unit composed of a supporting member that supports a discharge lamp, and a circuit substrate for mounting circuit elements (or circuit components) from which electric power is supplied to the discharge lamp.

2. Description of the Related Art

There are conventional techniques regarding discharge lamp units. Each of the conventional discharge lamps is composed mainly of a discharge lamp, a supporting member, and a circuit substrate. For example, a conventional discharge lamp unit uses a housing case capable of accommodating the circuit substrate. The housing case is made of a material of a low heat conductivity in order to prevent conduction of heat energy generated in the discharge lamp to the circuit substrate on which circuit elements (or circuit components) are mounted. Japanese patent laid open publication No. JP 2003-022702 discloses such a conventional technique regarding the discharge lamp unit.

In the conventional discharge lamp unit, the supporting member and an outer peripheral wall of the housing case are assembled together, where the supporting member supports the discharge lamp. When the outer peripheral wall of the housing case is heated by heat energy generated in the discharge lamp, it is difficult to prevent the conduction of heat energy to the circuit substrate.

SUMMARY OF THE INVENTION

It is an object of the present invention to provide a discharge lamp unit with heat insulating function, composed mainly of a supporting member capable of supporting a discharge lamp, and a circuit substrate, on which circuit elements (or circuit components) are mounted, capable of providing electric power to the discharge lamp. The discharge lamp unit reliably prevents any conduction of heat energy generated in the discharge lamp to the circuit substrate.

To achieve the above purposes, the present invention provides a discharge lamp unit having a supporting member, a circuit substrate, a housing case member, a separation wall, and a hollow part. The supporting member supports the discharge lamp. Circuit elements (or circuit components) are mounted on the circuit substrate. Electric power is supplied from the circuit substrate side to the discharge lamp which is supported by the supporting member. The housing case member supports the circuit substrate in an inside space thereof, and also supports the supporting member so that the supporting member is exposed to an outside of the housing case member. The separation wall separates the supporting member from the circuit substrate in the inside space of the housing case member. The hollow part is formed between the separation wall and the circuit substrate.

Because the discharge lamp unit according to the present invention has the separation wall, this structure makes it possible to shield conduction of heat energy generated in the discharge lamp toward the circuit substrate side when the supporting member is heated by the heat energy generated in the discharge lamp. Further, in the structure of the discharge lamp unit of the invention, the hollow part is formed between the separation wall and the circuit substrate. Because the hollow part is filled with air having a low heat conductivity rather than metal or resin, the presence of the hollow part makes it difficult to conduct the heat energy generated in the discharge lamp to the circuit substrate. In other words, the structure of the discharge lamp unit according to the invention makes it possible to reliably prevent heat energy generated in the discharge lamp from being conducted to the circuit substrate.

It is acceptable for the circuit substrate to be covered with covering member such as resin, like a mold IC. It is also possible for the circuit substrate not to be covered with any covering member.

In the discharge lamp unit as another aspect of the present invention, the housing case member supports the supporting member and the separation wall so that the supporting member is separated from the separation wall. That is, it is sufficient for the housing case member to support them without contacting the supporting member with the separation wall.

In the structure of the discharge lamp unit having the above structure, because the supporting member is not contact with the separation wall, it is possible to prevent the direct heat conduction from the supporting member to the separation wall. This makes it possible to suppress a temperature rise of the air in the separation wall, and further to prevent the temperature rise of the air in the hollow part. This can suppress the circuit substrate to be heated by the air in the hollow part.

In the discharge lamp unit as another aspect of the present invention, it is acceptable to further have a plurality of component mounting parts having a cup shape. Those component mounting parts are formed at the supporting member side in the housing case member observed from the separation wall side. Each of the component mounting parts has a bottom part which is a part of the separation wall.

In the discharge lamp unit as another aspect of the present invention, it is possible to place at least a part of circuit components forming the discharge lamp unit into the component mounting parts. Because each of the component mounting parts has a cup shape, each of the component mounting parts is filled with a filling material such as potting resin or resin after the circuit element is placed in each of the component mounting parts. Still further, because the component mounting parts are formed opposite to the hollow part observed from the separation wall, it is possible to prevent the hollow part from being filled with the filling member when the component mounting parts are filled with the filling member such as potting resin. That is, it is possible to reliably have the hollow part having a low heat conductivity in the housing case member of the discharge lamp unit.

Through the specification of the present invention, the "cup shape" indicates a structure composed of a bottom part and side wall parts. This bottom part is a part of the surface of the separation wall at the discharge lamp supporting unit side. These side wall parts serve as the side walls and the partition walls. Each of the side wall parts has an open part which is opposite to the bottom part. That is, the cup shape has a structure to prevent leakage of liquid filling material from each of the component mounting parts when each of the component mounting parts is filled with the liquid filling material.

In the discharge lamp unit as another aspect of the present invention, it is possible to further have one or more opening parts which are formed so that the hollow part communicates with an outside of the discharge lamp unit through the opening part.

The above structure of the discharge lamp unit makes it possible to discharge or replace the air in the hollow part to/with the outside of the discharge lamp unit, where the air in the hollow part is heated by heat energy of the circuit substrate and/or the discharge lamp, and to replace the air in the hollow part with the outside air of the discharge lamp unit because the hollow part communicated with the outside of the discharge lamp unit through the opening part. This structure makes it possible to prevent the circuit substrate from being heated through the heated air.

In the discharge lamp unit as another aspect of the present invention, it is possible to further have opening parts which are formed at axial ends of a flow passage in a direction of convection of air in the hollow part.

The above structure of the discharge lamp unit makes it possible to easily replace the air in the hollow part with the outside air of the discharge lamp unit because the opening parts are formed at both sides of the direction of convection of the air in the hollow part. The direction of convention approximately indicates the direction of upper and bottom when natural convection of air occurs in the hollow part. On the other hand, the direction of convention indicates the direction to flow the air in the hollow part when the convection of the air in the hollow part occurs by a fan such as an electric fan or by a running air flow of the vehicle when the vehicle is running.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
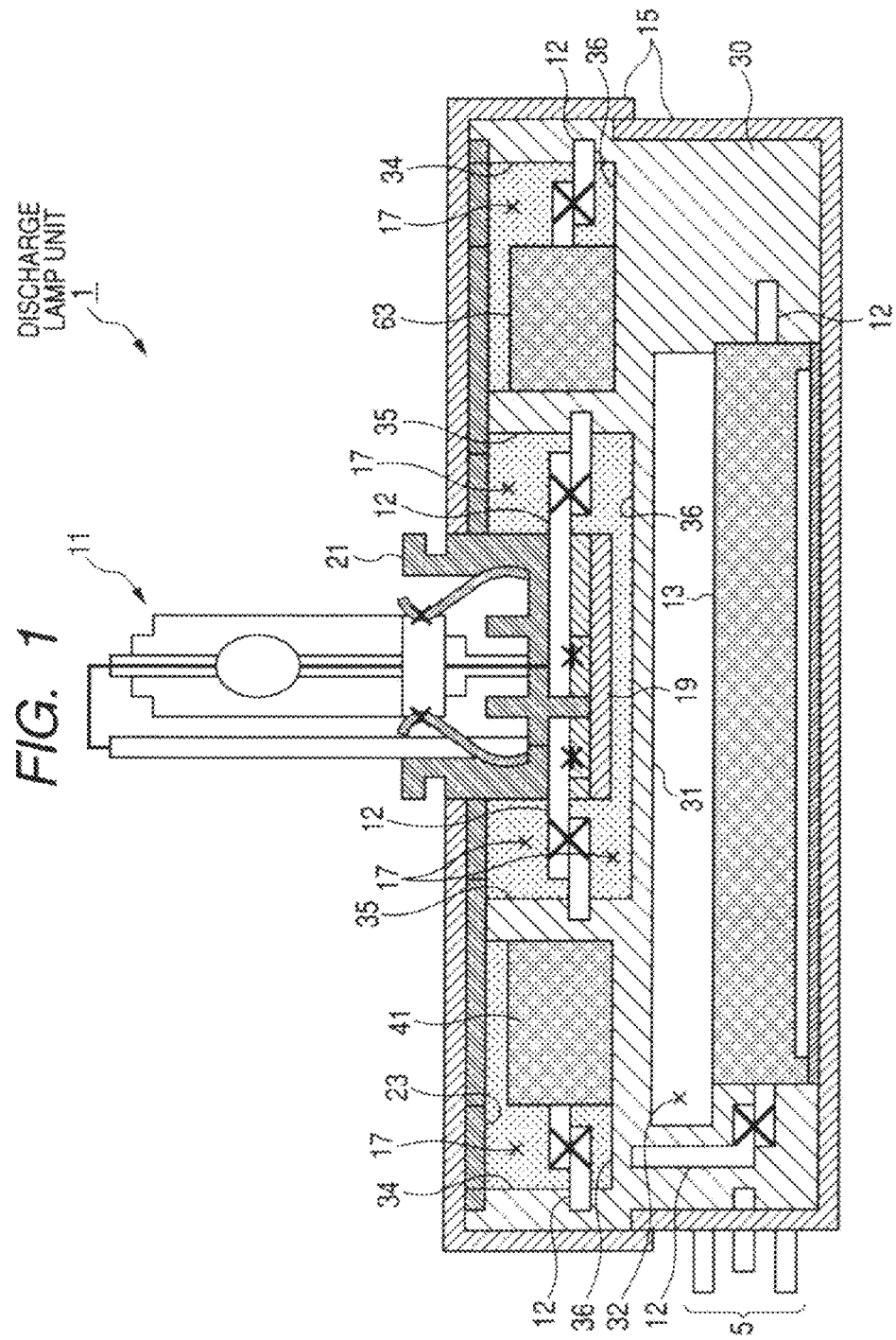
FIG. 1 is a cross section of a discharge lamp unit according to an embodiment of the present invention.

Hereinafter, various embodiments of the present invention will be described with reference to the accompanying drawings. In the following description of the various embodiments, like reference characters or numerals designate like or equivalent component parts throughout the several diagrams.

Embodiment

A description will be given of the discharge lamp unit 1 according to the present invention with reference to FIG. 1 to FIG. 3A and FIG. 3B.

FIG. 1 is a cross section of the discharge lamp unit 1 according to an embodiment of the present invention.

As shown in FIG. 1, the discharge lamp unit 1 has a housing case member 15 (or a housing case) which accommodates various components to supply electric power to a discharge lamp 11. In more detail, the housing case member 15 is made of metal such as aluminum or a stainless steel. For example, the housing case member 15 accommodates a circuit substrate 13 and circuit elements (or circuit components) such as coils and capacitors. Integrated circuits such as IC chips are placed on the circuit substrate 13. A part of a discharge lamp supporting part 21 (which serves as a supporting member) is exposed to an outside of the housing case member 15. This discharge lamp supporting part 21 supports the discharge lamp 11.

The housing case member 15 is composed of an upper part member (which is placed at the upper side in FIG. 1) and a bottom part member (which is placed at the bottom side in FIG. 1). The upper part member of the housing case member 15 supports the discharge lamp 11. The bottom part member of the housing case member 15 accommodates the circuit substrate 13. The upper part member faces the bottom part member, as shown in FIG. 1.

The upper part member of the housing case member 15 serves as a shielding member for electric waves or electromagnetic waves entering the inside of the housing case member 15. The bottom part member of the housing case member 15 serves as a shielding member for electric waves or electromagnetic waves entering the inside of the housing case member 15, and further serves as a heat sink to radiate or discharge heat energy in the inside of the housing case member 15.

It is possible to place a reflection member (not shown) having a reflecting surface of a concave shape between the housing case member 15 and the discharge lamp supporting part 21.

The inside of the housing case member 15 is divided into a plurality of parts or chambers by mold resin 30 having a predetermined shape. The mold resin 30 is obtained by injection molding, for example. That is, the mold resin 30 has a separation wall 31 with which the inside space of the housing case member 15 is divided between the discharge lamp supporting part 21 and the circuit substrate 13. The separation wall 31 has a plate part which is perpendicular to the optical axis of the discharge lamp 11.

The circuit substrate 13 is placed in a first floor part (as the bottom part observed from the separation wall 31, as shown in FIG. 1) which is separated by the separation wall 31 in the inside of the housing case member 15. On the other hand, the discharge lamp supporting part 21 is placed in a second floor part (as the upper part observed from the separation wall 31, as shown in FIG. 1) which is separated by the separation wall 31 in the housing case member 15.

As shown in FIG. 1, a hollow part 32 is formed between the separation wall 31 and the circuit substrate 13 in the first floor part of the housing case member 15. Any circuit element is not placed in the hollow part 32.

The hollow part 32 communicates with the outside of the discharge lamp unit 1 through opening parts 81, 82, and 83 (see FIG. 3).

It is designed to mount the discharge lamp unit 1 onto a vehicle so that these opening parts 81, 82, and 83 face both sides of a direction of air convection in the hollow part 32.

In the second floor part of the housing case member 15, side walls 34 and partition walls 35 made of the mold resin 30 form a plurality of chambers. The embodiment shown in FIG. 1 has three chambers. These side walls 34 and the partition walls 35 are formed in parallel to the optical axis of the discharge lamp 11.

The chambers having a cup shape form component mounting parts 36, in each of which at least a circuit element is placed.

Through the specification, the "cup shape" means a structure composed of a bottom part, side wall parts. This bottom part serves as the surface of the separation wall 31 at the discharge lamp supporting part 21 side. These side wall parts serve as the side walls 34 and the partition walls 35. Each of the side wall parts has an open part which is opposite to the bottom part.

After a circuit element is placed in each of the component mounting parts 36, the component mounting part 36 is filled with a liquid filling material 17 such as potting resin.

The discharge lamp supporting part 21 and a resin cover part 23 which cover at least a part of the component mounting part 36 are assembled together. The discharge lamp supporting part 21 is positioned and separated from the separation wall 31 at a predetermined distance without directly contacting with the separation wall 31.

In the structure of the discharge lamp unit 1 according to the embodiment of the invention shown in FIG. 1, a thermal insulation member 19 having a low heat conductivity rather than metal and resin is placed at the surface of the discharge lamp supporting part 21 at the separation wall 31 side (at the bottom side shown in FIG. 1). The space between the thermal insulation member 19 and the separating wall 31 is filled with the filling material 17. The thermal insulation member 19 is separated from the separating wall 31 by the filling material 17.

The discharge lamp unit 1 having the above structure is activated by supplying electric power through lead wires placed in a connector 5. This connector 5 projects toward the outside of the housing case member 15 of the discharge lamp unit 1

It is preferable to form the discharge lamp supporting part 21 and the resin cover part 23 by using a low heat-conductive material in order to shield heat conductivity from the discharge lamp 11 and the heat radiation from the discharge lamp 11.

Next, a description will be given of a configuration of a lighting circuit 3 in the discharge lamp unit 1 with reference to FIG. 2.

Figure 2:
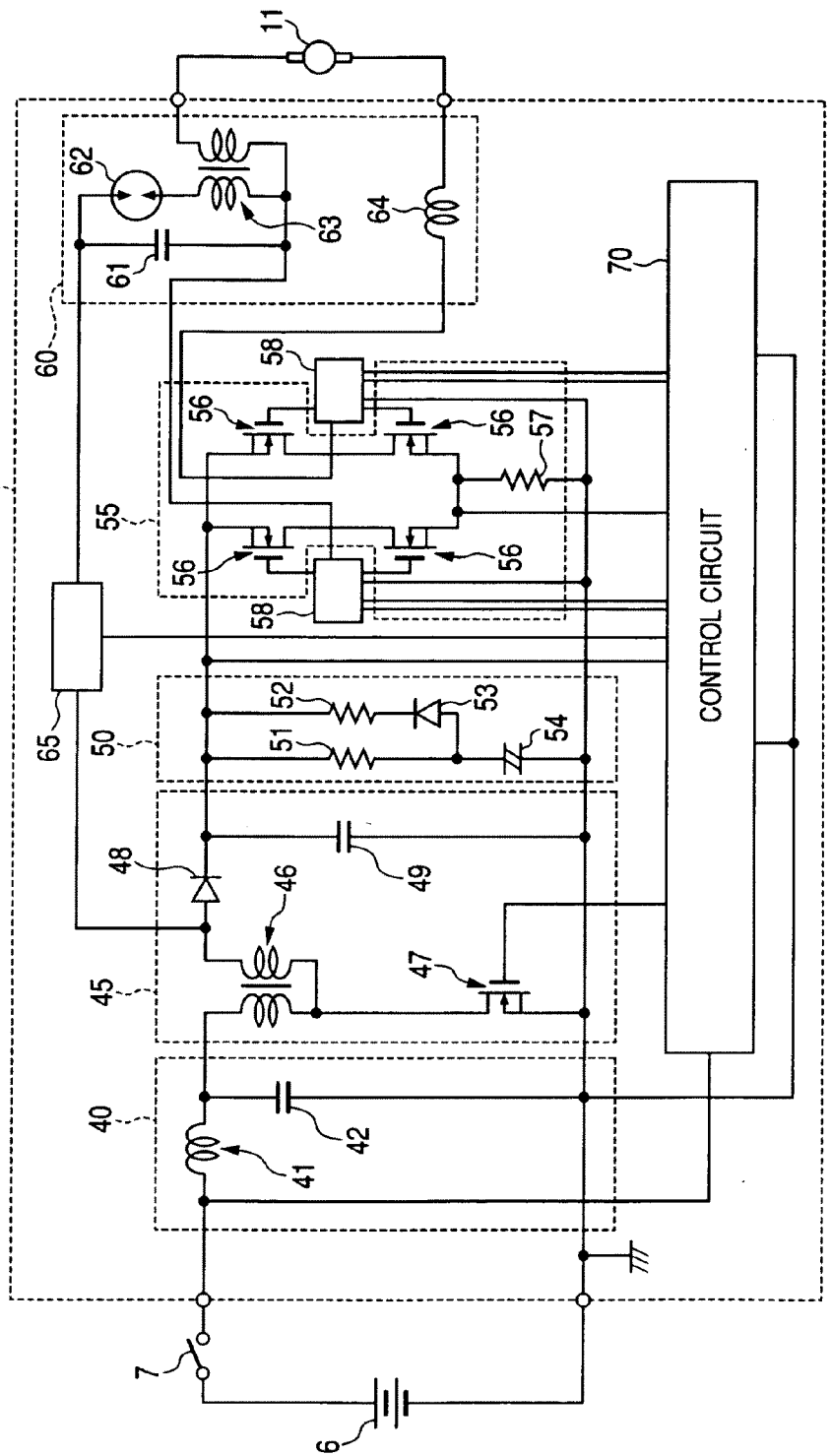
FIG. 2 is a view showing a configuration of a lighting circuit to light up a discharge lamp in the discharge lamp unit shown in FIG. 1.

FIG. 2 is a view showing a configuration of the lighting circuit 3 to light the discharge lamp 11 in the discharge lamp unit 1 shown in FIG. 1.

As shown in FIG. 2, a battery 6 and a switch 7 are placed at the outside of the discharge lamp unit 1. When the driver of a vehicle turns on the switch 7, electric power is supplied from the battery 6 to the discharge lamp unit 1.

As shown in FIG. 2, the lighting circuit 3 in the discharge lamp unit 1 has a filter circuit 40, a DC/DC converter circuit 45, a light supplementary circuit 50, a H bridge circuit 55, a high voltage generation circuit 60, and a control circuit 70.

The filter circuit 40 has an input coil 41 and an input capacitor 42. The filter circuit 40 serves as a smoothing circuit to smooth a voltage of a power source of the battery 6.

The DC/DC converter circuit 45 has a DC/DC transformer 46, a power MOS transistor 47 as a power element, a diode 48, and a capacitor 49.

The DC/DC converter circuit 45 serves as a converter circuit to boost the voltage of the power source (for example, 12 volts) to a lamp supply voltage (for example, 40 volts) which is supplied to the discharge lamp unit 1.

The light supplementary circuit 50 has two resistances 51 and 52, a diode 53, and an overtaking capacitor 54. The resistances 51 and 52 are connected in parallel to terminals of the power source. The diode 53 is connected in series to the resistance 52. The overtaking capacitor 54 is connected to the resistance 51 and the diode 53.

The light supplementary circuit 50 is a circuit to temporarily supply electric power to the discharge lamp 11, which is temporarily required when the discharge lamp 11 starts to light up. The overtaking capacitor 54 accumulates the electric power required when the discharge lamp 11 lights up.

The H bridge circuit 55 has four power transistors 56 and a resistance 57 which serves as a resistance to detect a current.

The H bridge circuit 55 is controlled by a driver 58 to switch those power transistors 56 when receiving an operation control signal transferred from a control circuit 70.

The output of the H bridge circuit 55 is converted from a direct current to an alternating current (that is, a square current) by the driver 58.

As shown in FIG. 2, the high voltage generation circuit 60 has a high voltage generating capacitor 61, a spark gap 62, a starter transformer 63, and a noise reduction coil 64.

The high voltage generating capacitor 61 charges a current to be supplied to a primary coil of the starter transformer 63. The spark gap 62 switches the discharging of the high voltage generating capacitor 61.

The starter transformer 63 provides a starter voltage (for example, 25 kV) to start the lighting up of the discharge lamp 11. A booster circuit 65 supplies a high voltage when receiving an operation control signal transferred from the control circuit 70. When the voltage of the spark gap 62 reaches a predetermined voltage, the spark gap 62 turns on in operation. The control circuit 70 has a semiconductor element to control circuit elements in the lighting circuit 3.

The control circuit 70, the H bridge circuit 55, and the driver 58 are mounted on the circuit substrate 13.

Next, a description will now be given of an actual arrangement of the circuit elements which form the lighting circuit 3 with reference to FIG. 3A and FIG. 3B.

Figure 3A:
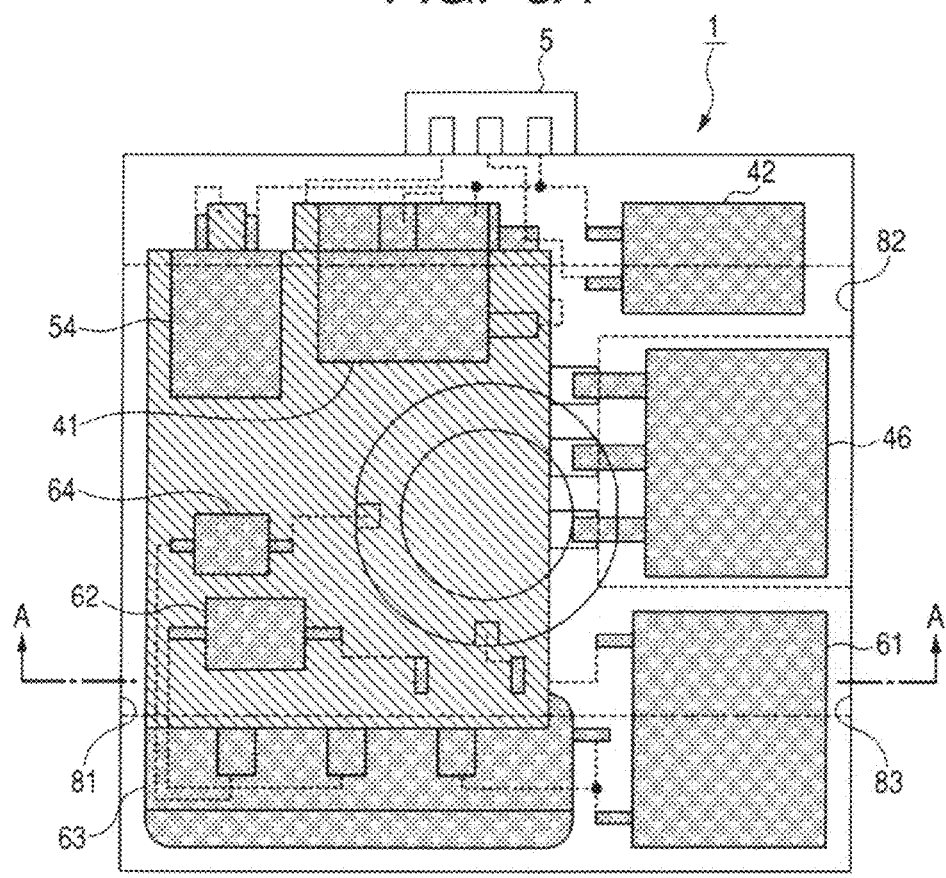
FIG. 3A is a view showing a housing case member observed from the discharge lamp side.

FIG. 3A is a view showing the housing case member 15 observed from the discharge lamp 11 side. FIG. 3B is a cross section of the housing case member 15 along A-A line shown in FIG. 3A.

The arrangement of the circuit elements which form the lighting circuit 3 is designed to decrease the size of the housing case member 15 as small as possible. That is, in the circuit configuration shown in FIG. 2, the circuit elements near to the battery 6 (as the circuit elements near to the left side in FIG. 2) are placed near to the connector 5 (at the upper side shown in FIG. 3A). The circuit elements of the lighting circuit 3 near to the discharge lamp 11 side (as the circuit elements near to the right side in FIG. 2) are separated from the connector 5 (at the bottom side shown in FIG. 3A) as far as possible.

Specifically, in the circuit configuration of the lighting circuit 3 in the discharge lamp unit 1 according to the embodiment, the input coil 41 and the input capacitor 42 which form the filter circuit 40 are arranged near to the connector 5. The overtaking capacitor 54, one terminal of which is grounded, is arranged in parallel to the input coil 41 near to the connector 5. This arrangement prevents noise input through the connector 5 from being propagated toward a deep part in the housing case member 15 because the filter circuit 40 is placed near to the connector 5 capable of eliminating noise.

The high voltage generating capacitor 61 and the starter transformer 63, which form the high voltage generation circuit 60, are placed in parallel at the position which is most separated from the connector 5.

The spark gap 62 and the noise reduction coil 64, which form the high voltage generation circuit 60, are placed near to the starter transformer 63 and at the upper side of the circuit substrate 13.

Figure 3B:
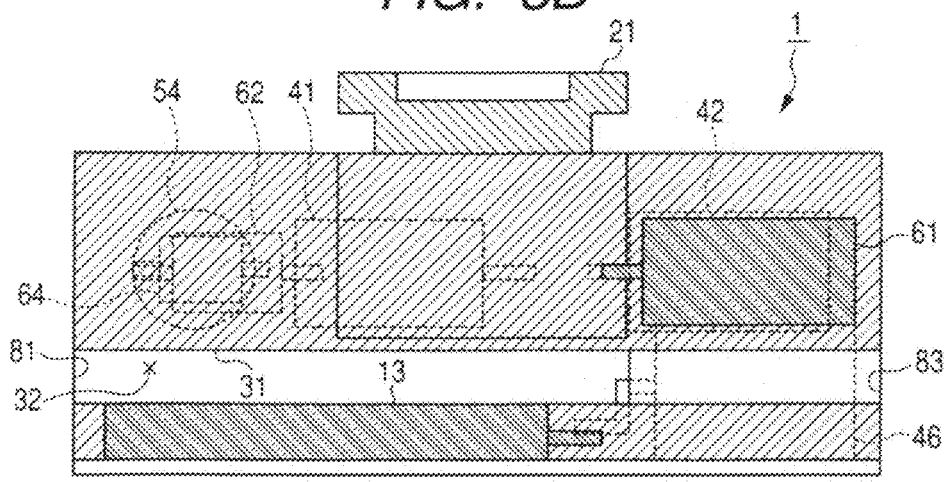
FIG. 3B is a cross section of the housing case member along A-A line shown in FIG. 3A.

As shown in FIG. 3B, it is designed so that the input coil 41, the input capacitor 42, the overtaking capacitor 54, the high voltage generating capacitor 61, the spark gap 62, and the noise reduction coil 64 have approximately a same height (in the direction of the upper and bottom in FIG. 3B). Those are placed in the second floor part observed from the upper side of the separation wall 31.

This arrangement of the circuit elements of the lighting circuit 3 can eliminate a dead gap formed at the upper side of the other circuit elements placed in the second floor part when the height of the second floor part is set as the maximum height of the circuit elements. This can decrease a dead space in the second floor part of the housing case member 15.

In addition, because the most circuit elements of the high voltage generation circuit 60 are placed in the second floor part near to the discharge lamp supporting part 21, it is possible to decrease the length of wiring between the high voltage generation circuit 60 and the discharge lamp supporting part 21. This can prevent a high-voltage loss.

By the way, the DC/DC transformer 46 is placed between the input capacitor 42 and the high voltage generating capacitor 61 of the high voltage generation circuit 60. The DC/DC transformer 46 has relatively a high height. When the circuit element having a relatively high height is placed in the first floor part, it is possible to efficiently place the circuit elements having a maximum height, which is a sum of the first floor part and the second floor part, in the housing case member 15.

As described above, in the discharge lamp unit 1 having the above structure according to the embodiment of the present invention, the housing case member 15 supports the circuit substrate 13 therein, and supports the discharge lamp supporting part 21 so that the discharge lamp supporting part 21 is exposed to the outside of the housing case member 15. The separation wall 31 separates the circuit substrate 13 from the discharge lamp supporting part 21 in the inner space of the housing case member 15.

In addition, the hollow part 32 is formed between the separation wall 31 and the circuit substrate 13 in the first floor part of the housing case member 15

According to the discharge lamp unit 1 having the above structure, the separation wall 31 can prevent heat energy generated in the discharge lamp 11 from being conducted to the circuit substrate 13 side even if the heat energy of the discharge lamp 11 heats the discharge lamp supporting part 21.

Further, because the discharge lamp unit 1 has the hollow part 32 which is formed between the separation wall 31 and the circuit substrate 13 and filled with air having a low heat conductivity rather than metal and resin, this makes it difficult to conduct the heat energy of the discharge lamp 11 toward the circuit substrate 13 side. This structure reliably prevents the heat conduction from the discharge lamp 11 side toward the circuit substrate 13 side.

Still further, the housing case member 15 supports the discharge lamp supporting part 21 and the separation wall 31 so that the discharge lamp supporting part 21 is separated from the separation wall 31. That is, the discharge lamp supporting part 21 and the separation wall 31 are supported while they are not contacted to each other.

Because the discharge lamp supporting part 21 does not contact with the separation wall 31 in the discharge lamp unit 1, this structure makes it possible to avoid a direct conduction of heat energy from the discharge lamp supporting part 21 to the separation wall 31. Because this can suppress the increasing of the temperature of the air in the hollow part 32, it is possible to suppress the temperature rise of the separation wall 31, and also suppress the heating of the circuit substrate 13 by the air in the hollow part 32.

Still further, the component mounting parts 36 having a cup shape are formed at the discharge lamp supporting part 21 side of the separation wall 31 so that the bottom part of each of the component mounting parts 36 is placed at the separation wall 31 side.

In the discharge lamp unit 1 according to the embodiment of the present invention, it is possible to place at least one of the circuit elements forming the discharge lamp unit 1 on each of the component mounting parts 36. Further, because each of the component mounting parts 36 has a cup shape, it is possible for each of the component mounting parts 36 to be filled with moisture resistance material such as potting resin in order to increase its moisture resistance function after the circuit element is placed in the component mounting part 36. Because the component mounting parts 36 are formed at the opposite parts to the hollow part 32 through the separation wall 31, this can prevent the potting resin from leaking into the hollow part 32 when the component mounting parts 36 are filled with the potting resin. In other words, the structure of the inside of the housing case member 15 can maintain the hollow part 32 even if the component mounting parts 36 are filled with the potting resin.

Still further, the discharge lamp unit 1 has the opening parts 81, 82, and 83 in order to communicate the hollow part 32 with the outside of the discharge lamp unit 1.

In the discharge lamp unit 1 according to the embodiment of the present invention, it is possible to discharge the air in the hollow part 32, which is heated by the heat energy of the discharge lamp 11, to the outside of the discharge lamp unit 1. This structure of the discharge lamp unit 1 can prevent the circuit substrate 13 from being heated by the air which is heated by the heat energy of the discharge lamp 11.

In addition, the opening parts 81, 82, and 83 are placed at the both sides of the direction of convection of the air circulated in the hollow part 32.

In the discharge lamp unit 1 according to the embodiment of the present invention, because the opening parts 81, 82, and 83 are formed at the both sides of the direction of convection of the air in the hollow part 32, it is possible to easily replace the air in the hollow part 32 with the outside air of the discharge lamp 11. The direction of convention approximately indicates the direction of upper and bottom when natural convection of the air occurs in the hollow part 32. On the other hand, the direction of convention indicates the direction to flow the air in the hollow part 32 when the convection of the air in the hollow part 32 occurs by a fan such as an electric fan or a running air flow of the vehicle when the vehicle is running.

In the discharge lamp unit 1 according to the embodiment of the present invention, because the separation wall 31 is placed between the circuit elements and the circuit substrate 13 which generates a large amount of heat, this can prevent heat energy of the circuit substrate 13 from being conducted to the circuit elements.

The concept of the present invention is not limited by the embodiment previously described. It is possible to apply the concept of the present invention to various types of modifications.

For example, in the structure of the embodiment previously described, the circuit elements are not placed on the DC/DC transformer 46. The present invention is not limited by this structure. For example, it is possible to place a part of the circuit elements on the DC/DC transformer 46 according to the limited area of the upper side of the DC/DC transformer 46. In this structure, it is possible to adjust the position of the separation wall 31 so that the position of the upper surface of the DC/DC transformer 46 is approximately equal to the position of the separation wall 31. That is, it is possible to place the circuit elements having a higher height without effecting the arrangement of the component placed in the second floor part as long as the height of the components forming the DC/DC transformer 46 is approximately equal to a sum of the height of the circuit substrate 13 and the height of the hollow part 32.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A discharge lamp unit comprising:
   a supporting member supporting a discharge lamp;
   a circuit substrate for supplying electric power to the discharge lamp;
   a housing case member which supports the circuit substrate in an inside space thereof and supports the supporting member so that the supporting member is exposed to an outside of the housing case member;
   a separation wall which separates the supporting member from the circuit substrate in the inside space of the housing case member;
   a hollow part formed between the separation wall and the circuit substrate; and
   a plurality of component mounting parts having a cup shape formed at the supporting member side observed from the separation wall, wherein each of the component mounting parts has a bottom part, and the bottom part is a part of the separation wall;
   wherein the housing case member supports the supporting member and the separation wall so that the supporting member is separated from the separation wall, and the supporting member is arranged at a predetermined distance from the separation wall.

2. The discharge lamp unit according to claim 1, further comprising an opening part formed so that the hollow part communicates with an outside of the discharge lamp unit.

3. The discharge lamp unit according to claim 1, wherein opening parts are formed at axial ends of a flow passage in a direction of convection of air in the hollow part.

4. The discharge lamp unit according to claim 1, wherein the separation wall is made of mold resin, and separates the supporting member from the circuit substrate in the inside space of the housing case member, and the separation wall is arranged perpendicular to a direction of an optical axis of the discharge lamp.

5. The discharge lamp unit according to claim 1, wherein no component is placed in an inside space of the hollow part.

6. The discharge lamp unit according to claim 1, wherein the supporting member is placed such that the supporting member does not directly contact the separation wall.

7. A discharge lamp unit comprising:
   a supporting member supporting a discharge lamp;
   a circuit substrate for supplying electric power to the discharge lamp;
   a housing case member which supports the circuit substrate in an inside space thereof and supports the supporting member so that the supporting member is exposed to an outside of the housing case member;
   a separation wall which separates the supporting member from the circuit substrate in the inside space of the housing case member;
   a hollow part formed between the separation wall and the circuit substrate; and
   an opening part formed so that the hollow part communicates with an outside of the discharge lamp unit;
   wherein the housing case member supports the supporting member and the separation wall so that the supporting member is separated from the separation wall, and the supporting member is arranged at a predetermined distance from the separation wall.

8. The discharge lamp unit according to claim 7, wherein the separation wall is made of mold resin, and separates the supporting member from the circuit substrate in the inside space of the housing case member, and the separation wall is arranged perpendicular to a direction of an optical axis of the discharge lamp.

9. The discharge lamp unit according to claim 7, wherein no component is placed in an inside space of the hollow part.

10. The discharge lamp unit according to claim 7, wherein the supporting member is placed such that the supporting member does not directly contact the separation wall.

11. A discharge lamp unit comprising:
    a supporting member supporting a discharge lamp;
    a circuit substrate for supplying electric power to the discharge lamp;
    a housing case member which supports the circuit substrate in an inside space thereof and supports the supporting member so that the supporting member is exposed to an outside of the housing case member;
    a separation wall which separates the supporting member from the circuit substrate in the inside space of the housing case member; and
    a hollow part formed between the separation wall and the circuit substrate, wherein opening parts are formed at axial ends of a flow passage in a direction of convection of air in the hollow part;
    wherein the housing case member supports the supporting member and the separation wall so that the supporting member is separated from the separation wall, and the supporting member is arranged at a predetermined distance from the separation wall.

12. The discharge lamp unit according to claim 11, wherein the separation wall is made of mold resin, and separates the supporting member from the circuit substrate in the inside space of the housing case member, and the separation wall is arranged perpendicular to a direction of an optical axis of the discharge lamp.

13. The discharge lamp unit according to claim 11, wherein no component is placed in an inside space of the hollow part.

14. The discharge lamp unit according to claim 11, wherein the supporting member is placed such that the supporting member does not directly contact the separation wall.

* * * * *